(12) United States Patent
Ditto

(10) Patent No.: US 8,604,446 B2
(45) Date of Patent: Dec. 10, 2013

(54) DEVICES AND METHODS FOR CRYO LIFT-OUT WITH IN SITU PROBE

(75) Inventor: Jeffrey J. Ditto, Eugene, OR (US)

(73) Assignee: The State of Oregon Acting by and through the State Board of Higher Education on Behalf of the University of Oregon, Eugene, OR (US)

( * ) Notice: Subject to any disclaimer, the term of this patent is extended or adjusted under 35 U.S.C. 154(b) by 0 days.

(21) Appl. No.: 13/570,127

(22) Filed: Aug. 8, 2012

(65) Prior Publication Data

US 2013/0037706 A1    Feb. 14, 2013

Related U.S. Application Data

(60) Provisional application No. 61/521,314, filed on Aug. 8, 2011, provisional application No. 61/607,511, filed on Mar. 6, 2012.

(51) Int. Cl.
*G01N 1/28* (2006.01)

(52) U.S. Cl.
USPC ... 250/443.1; 250/310; 250/311; 250/440.11; 250/428; 250/429

(58) Field of Classification Search
USPC ............ 250/306, 307, 309, 310, 311, 440.11, 250/443.1, 428, 429, 432 R, 492.1, 492.3
See application file for complete search history.

(56) References Cited

U.S. PATENT DOCUMENTS

| | | | |
|---|---|---|---|
| 5,992,158 A * | 11/1999 | Goddard et al. | 62/51.2 |
| 6,420,722 B2 | 7/2002 | Moore et al. | |
| 6,570,170 B2 | 5/2003 | Moore | |
| 6,626,902 B1 | 9/2003 | Kucharczyk et al. | |
| 6,805,390 B2 | 10/2004 | Nakayama et al. | |
| 7,381,971 B2 * | 6/2008 | Moore et al. | 250/442.11 |
| 7,394,075 B1 * | 7/2008 | Wang | 250/440.11 |
| 7,414,252 B2 * | 8/2008 | Moore et al. | 250/492.21 |
| 7,870,616 B2 | 1/2011 | Meister et al. | |
| 8,288,740 B2 * | 10/2012 | Amador | 250/492.21 |
| 2001/0045511 A1 * | 11/2001 | Moore et al. | 250/221 |
| 2006/0091325 A1 * | 5/2006 | Moore et al. | 250/492.21 |
| 2006/0261270 A1 | 11/2006 | Burkhardt et al. | |
| 2008/0296498 A1 | 12/2008 | Hong | |
| 2009/0000400 A1 * | 1/2009 | Hayles et al. | 73/863.12 |
| 2009/0146075 A1 * | 6/2009 | Schmid et al. | 250/442.11 |

(Continued)

OTHER PUBLICATIONS

Hayles et al., "The making of frozen-hydrated, vitreous lamellas from cells for cryo-electron microscopy," Journal of Structural Biology 172 (2010) 180-190.

(Continued)

*Primary Examiner* — Michael Logie
(74) *Attorney, Agent, or Firm* — Lumen Patent Firm

(57) ABSTRACT

Cryogenic manipulation of a material sample with an in situ probe is enabled with a novel cooled probe design. A material sample mounted on a cryo-stage in a vacuum chamber is cooled to a cryogenic temperature. In addition, a nano-manipulator probe inside the sample chamber is also cooled to cryogenic temperature. A specific sample site is milled in the chamber using a focused ion beam and attached to the cooled probe by vapor deposition. After releasing the sample, the sample site is attached to a destination surface such as a transmission electron microscope (TEM) grid and the probe is then detached from the sample using the focused ion beam.

5 Claims, 12 Drawing Sheets

(56) References Cited

U.S. PATENT DOCUMENTS

| | | | |
|---|---|---|---|
| 2009/0294690 A1* | 12/2009 | Moore et al. | 250/441.11 |
| 2010/0274237 A1* | 10/2010 | Yamakawa et al. | 606/23 |
| 2010/0305747 A1 | 12/2010 | Agorio et al. | |
| 2011/0125050 A1 | 5/2011 | Bau et al. | |
| 2012/0286175 A1* | 11/2012 | Searle et al. | 250/492.3 |
| 2013/0091875 A1* | 4/2013 | Hartfield | 62/62 |

OTHER PUBLICATIONS

MoberlyChan et al., "Cryo-FIB for Thinning Cryo-TEM Samples and Evading Ice During Cryo-transfer," Microsc Microanal 11(Suppl 2), 2005.

Rigort et al., "Focused ion beam micromachining of eukaryotic cells for cryoelectron tomography," PNAS, Mar. 20, 2012, vol. 109, No. 12, 4449-4454.

\* cited by examiner

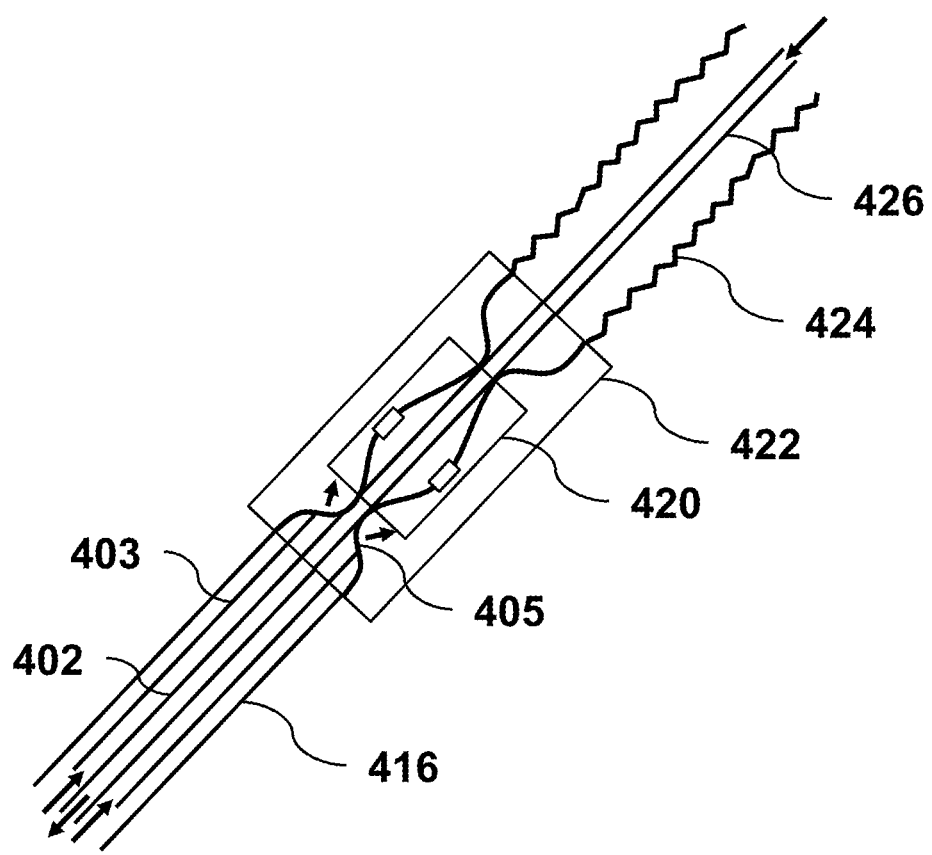

DEVICES AND METHODS FOR CRYO LIFT-OUT WITH IN SITU PROBE

CROSS-REFERENCE TO RELATED APPLICATIONS

This application claims priority from U.S. Provisional Patent Application 61/521,314 filed Aug. 8, 2011, which is incorporated herein by reference. This application also claims priority from U.S. Provisional Patent Application 61/607,511 filed Mar. 6, 2012, which is incorporated herein by reference.

FIELD OF THE INVENTION

The invention relates generally to nanomanipulators used in dual-beam scanning electron microscope (SEM) and focused ion beam (FIB) instruments (also referred to as FIB-SEM).

BACKGROUND OF THE INVENTION

The transmission electron microscope (TEM) has been used for years to study biological systems down to angstrom level resolution but typical samples are prepared using chemical fixation, staining, and dehydration which can introduce artifacts. Vitrification of samples (rapidly cooling liquid into an amorphous solid phase) preserves the delicate spatial organization of hydrated systems without the damage produced when crystalline water is formed. It is well known that vitrified prokaryotic cells can be studied using the transmission electron microscope but the technique is limited to specimens with a maximum thickness of 0.5 to 1 micrometers. Even with the ability to study such thick samples, the resolution is greatly diminished by the increased interaction volume of the beam. Cryo-ultramicrotomy is a possible technique for preparing thin TEM samples regardless of cell size, but samples prepared in this manner often become distorted and deformed by the cutting process. Artifacts include compression of features of up to 50% in the cutting direction. Additionally, cryo-ultramicrotomy does not provide a method for choosing a site of interest for preparation and often many attempts are required before a useful sample is prepared.

FIBSEM sample preparation for later analysis in a transmission electron microscope (TEM) or scanning transmission electron microscope (STEM) has become the preferred technique in the field of electron microscopy. Using the TEM or STEM requires an electron transparent section which usually means the sample is less than 100 nanometers thick for high resolution purposes. The combination of a nanomanipulator, SEM and FIB in one chamber allows site-specific sample preparation and has proven to be valuable to material science and semiconductor research and failure analysis. This technique, however, is currently not available to those who wish to study hydrated systems such as biological samples or those who have samples which are reactive under charged particle beams such as polymers and other unstable films. Cryogenically cooled samples will not maintain cold temperatures necessary for preservation when in contact with an ambient temperature probe.

Some commercially available nanomanipulators have a rod which runs from the outside to the inside of the chamber. Other manipulators are mounted inside the vacuum chamber. Existing nanomanipulator probes cannot be used with hydrated systems such as biological samples or those who have samples which are reactive under charged particle beams such as polymers and other unstable films.

For these and other reasons, FIBSEM in-situ TEM sample preparation with a nanomanipulator probe is considered by many in the field to be impossible. For example, Moberly-Chan, W., Marko, M. & Hsieh, C. (2005). Cryo-FIB for thinning cryo-TEM samples and evading ice during cryo-transfer. Microsc Microanal 11, Suppl 2, writes, "The ultimate may be to FIB-section into a large block of material and then "lift-out" a cryo-section for the TEM. However, "lift-out" methods remain difficult." The reasons are explained further by Hayles M., Winter, D., Schneijdenberg, C., Meeldijk, J., Luecken, U., Persoon, H., Water, J., Jong, F., Humbel, B., and Verkleij, A. (2010). The making of frozen-hydrated, vitreous lamellas from cells for cryo-electron microscopy. J. Struct. Biol. 172, 180-190: " . . . the main technique of 'lift-out' cannot be used under cryogenic conditions due to two facts: the lift-out device, which is usually an ultra sharp needle, cannot support the vitreous temperature the sample needs and secondly the process of welding the needle to the sample using the gas injection system (GIS) will not work at cryogenic temperature well enough for such fine welds to be made." Alexander Rigort, Felix J. B. Bäuerleinl, Elizabeth Villa, Matthias Eibauer, Tim Laugks, Wolfgang Baumeister, and Jürgen M. Plitzko (2012). Focused ion beam micromachining of eukaryotic cells for cryoelectron tomography. PNAS 109, no 12, 4449-4454, states that "Approaches such as used in the materials science (see e.g., ref 14), namely to prepare thin electron transparent windows, lift them out, and place them on EM grids, are difficult if not impossible to realize with samples which must be kept below the devitrification temperature (<−140° C.) at all times."

SUMMARY OF THE INVENTION

In view of the above, it is surprising and unexpected that the present inventor has developed a method and probe design to make possible for the first time in situ cryogenic lift-out (cryo-INLO) and make FIBSEM sample preparation available to new research areas.

Skepticism associated with cryo-INLO stemmed from two challenges. First, cryogenically cooled samples will heat if touched by an ambient temperature probe, and cooling the probe in such a limited space is not considered feasible; nevertheless the present inventor has developed an actively cooled probe which can maintain the temperatures required during the lift-out procedure. Second, site-specific organo-metallic deposition has not been accomplished at cryogenic temperatures. Currently used gases condense upon contact with any portion of the sample. The present process addresses this issue by depositing a thin blanket-film over the entire sample (using a GIS) while the probe is near to or contacts the area of interest.

In one aspect, the invention provides a method for cryogenic manipulation of a material sample with an in situ probe. The method includes a) mounting the material sample on a cryo-stage in a vacuum chamber; b) cooling the cryo-stage to a cryogenic temperature; c) cooling a nano-manipulator probe inside the sample chamber; d) milling inside the sample chamber a specific sample site of the material sample using a focused ion beam; e) attaching the sample site to the cooled probe by vapor deposition of a first blanket layer while the cooled probe is in proximity to the sample site; f) attaching the sample site to a destination surface inside the sample chamber (e.g., a transmission electron microscope (TEM) grid.) by vapor deposition (e.g., using FIB-induced material deposition) of a second blanket layer; and g) detaching the probe from the sample, e.g., using the focused ion beam.

The cooling of the probe may be performed by cooling the probe by thermal conduction, by flowing cryogenic gas to the probe, by conduction from a cold surface in the chamber, using a thermoelectric device, or by expanding a compressed gas in a space in contact with the probe (such as methods used in cryo-pumps for vacuum chambers).

The method may also include performing cryogenic temperature microscopy on the sample site inside the sample chamber (e.g., using electrons, photons, or ions). Additional steps which may be include in the method are cutting the sample site free using the focused ion beam, removing the first blanket layer using the focused ion beam, removing the second blanket layer using the focused ion beam, transferring the sample site to another instrument for analysis (e.g., transmission electron microscope, Time-of-Flight Secondary Ion Mass Spectrometer (TOF-SIMS), or atom probe), and/or performing geometric modification of samples using the focused ion beam (e.g., thinning to a thin lamella for TEM or sharp point for atom probe).

In some embodiments, the probe may be composed in part of zirconium tungstate. These and other features of the invention will become apparent from the following description and associated drawings.

BRIEF DESCRIPTION OF THE DRAWINGS

FIGS. 4A-D illustrate details of probe designs, according to embodiments of the present invention.

DETAILED DESCRIPTION

According to one embodiment of the invention, a novel nanomanipulator probe allows the use of FIBSEM as a nanofabrication tool for transition electron microscopy (TEM) sample preparation.

Figure 1:
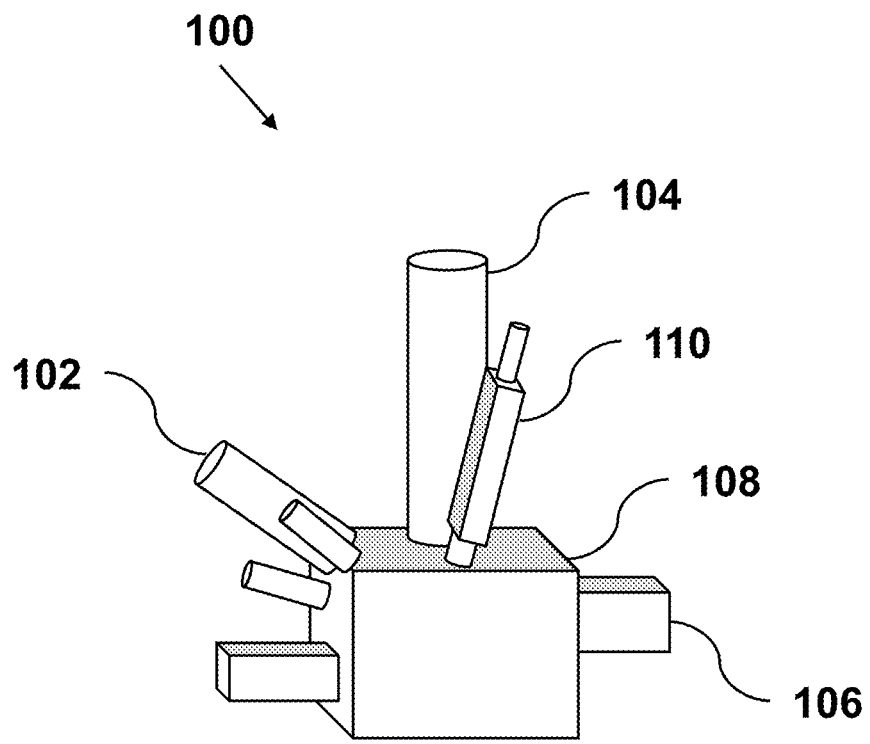
FIG. 1 illustrates a conventional dual-beam focused ion beam system equipped with a nanomanipulator probe.
Figure 2:
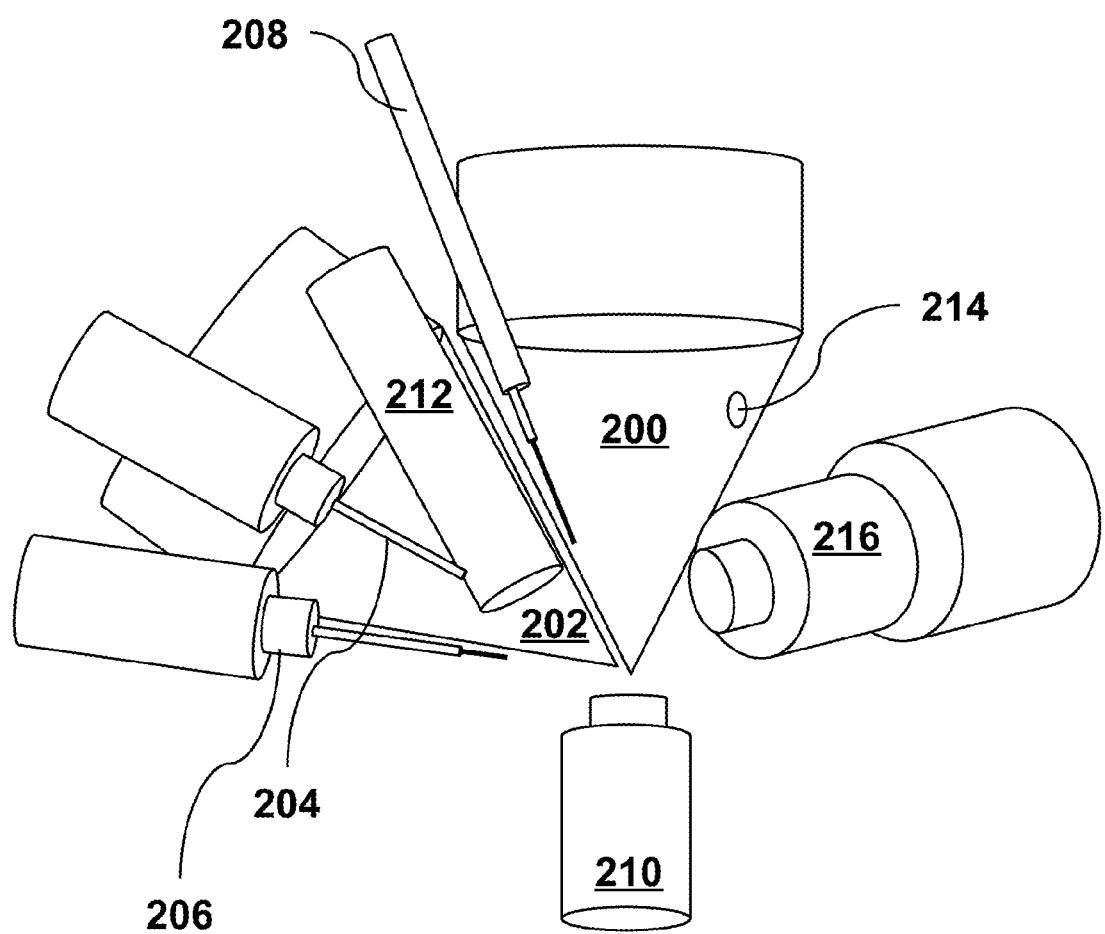
FIG. 2 illustrates the detail near the probe tip inside the sample chamber of the system shown in FIG. 1.

FIG. 1 illustrates a conventional dual-beam focused ion beam system (FEI Helios D500) equipped with an Autoprobe 200 by Omniprobe. The system 100 includes a Ga+ ion gun 102, an electron gun 104, cryo/deposition preparation chamber 106, sample chamber 108, and nanomanipulator 110. FIG. 2 illustrates the detail inside the sample chamber of FIG. 1, including E-beam 200, Ibeam 202, GIS nozzles 204 and 206, micromanipulator probe needle 208, sample stage 210, and image detectors 212, 214, 216. Notice that the sample sits as close as 4 mm from the numerous probes, detectors, and beams of the instrument, leaving very little space for the addition of any cooling lines to the nanomanipulator. The space between the microscope column and the sample is 4 mm and there are detectors, gas injectors, the probe, an energy dispersive x-ray detector, and charge neutralizer all mounted near the sample and the stage has the capability to tilt up to 60 degrees while holding the sample 4 mm from the microscope column. With the limited space, it is less practical to add coolant lines that are large enough to cool a probe to cryogenic temperatures.

Figure 3A:
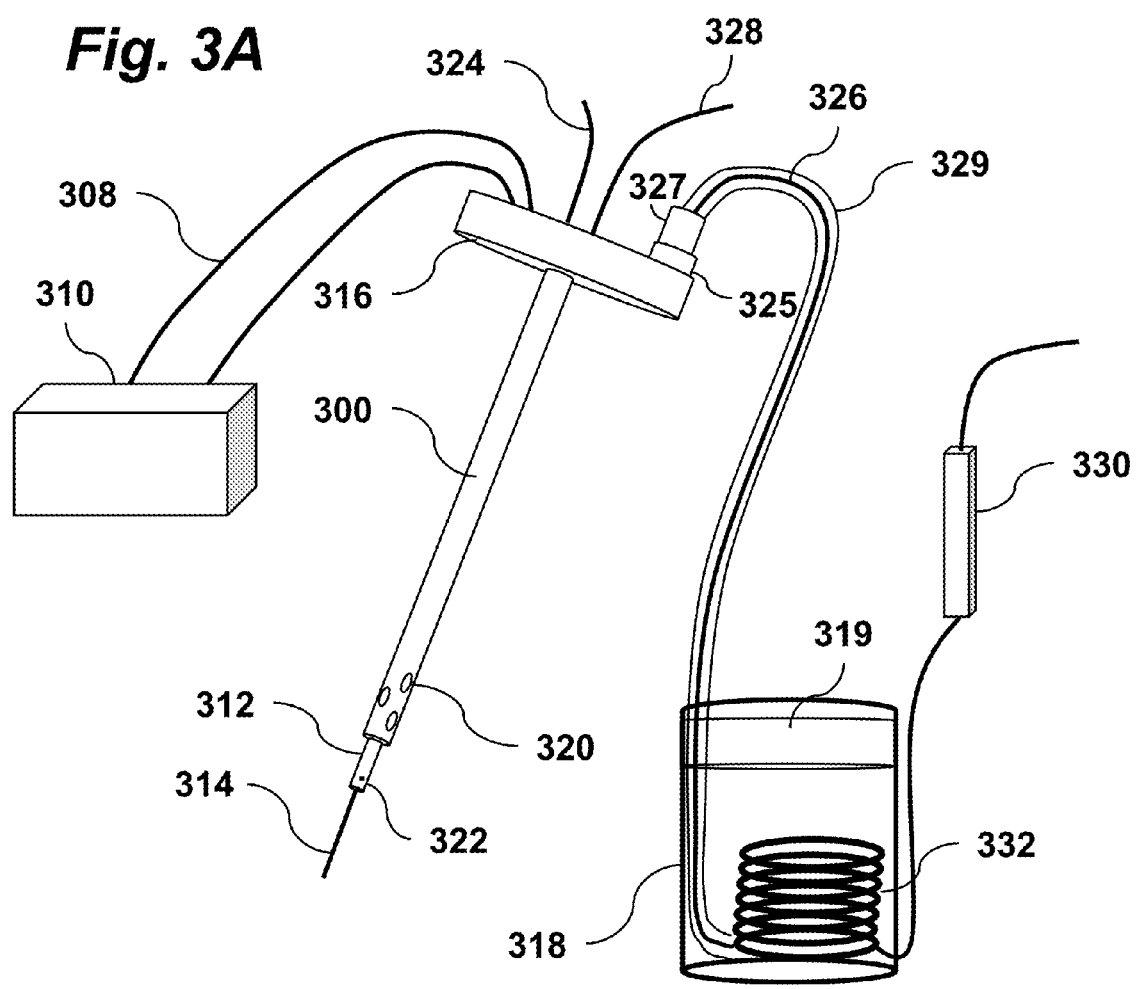
FIGS. 3A-B illustrate an apparatus including a probe made of concentric hollow tubes through which coolant flows up and down the length of the probe, according to an embodiment of the present invention.
Figure 3B:
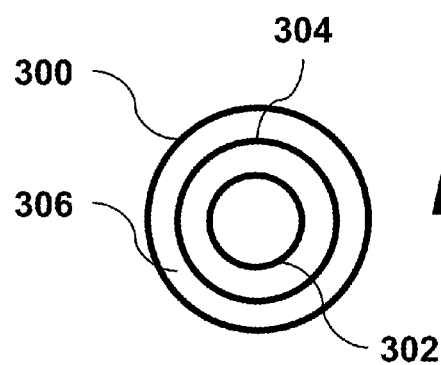

According to one embodiment of the present invention, the nanomanipulator probe of FIGS. 1 and 2 that overcomes the above difficulties is provided. In the probe design shown in FIGS. 3A-B, the long rod which runs the length of the nanomanipulator mechanism is replaced with a stainless steel hollow tube 300 of the same outer diameter. This novel design provides a conduit for accessing areas very close to the sample with no necessary modifications to the sensitive hardware inside the chamber. Coaxially contained within the hollow tube are a small coolant intake tube 302 and exhaust tube 304. The space between tubes 300 and 302 is a conduit 306 for thermocouple wiring 308 which runs the length of the tube and out to a thermometer display 310. Holes 320 in tube 300 allow conduit 306 to maintain a high vacuum within the chamber. The probe interior 306 is exposed to a high vacuum environment which provides insulation to the coolant lines running the center of the tube. At the end of the tube inside the instrument is a copper heat sink probe tip 312 which holds the standard tungsten probe needle 314. The probe preferably has a threaded tip attachment for anti-thermal expansion devices to allow for material changes.

At the opposite end of the probe are machined inlet and outlet ports 326, 328 which provide a built-in manifold for the coolant. A bushing connects the probe to a higher diameter tube allowing for a standard sized vacuum port cover 316 equipped with feedthroughs for the coolant tubing input 326 and output 328 and sensor wiring 324. Bellows 325 allow thermal contraction of inner cooling tubes 326, 328. Gas cooling junction 327 allows complete rotation of the probe at cryogenic temperatures, as will be described in more detail in relation to FIG. 4C below.

Coolant is transferred to the probe from a dewar 318 via a vacuum transfer hose 329. The coolant may be gaseous nitrogen cooled by submerging the tubing in liquid nitrogen 318 before entering the probe. A flow regulator 330 with needle valve may also be used to control the flow of the coolant. The dewar 318 preferably has a bellows 319 and is preferably mounted on a vibrationally-isolated stage allowing rotation. Additional mass can help isolate apparatus from vibration, esp. from boiling liquid nitrogen.

In addition to providing vacuum-insulated cooling lines to reach the probe tip and work area of the instrument, the tubes also provide a conduit 306 for wiring. Holes 322 near the tip of the probe allow for wiring 324 to pass from the conduit 306 into the chamber. Wiring allows for additional sensors and detectors to be mounted near the tip of the probe and provide tremendous versatility. This could include backscatter and secondary electron detectors, electrical characterization probing such as that of electron beam induced current (EBIC), atomic force microscopy (AFM), and fixtures for localized sample grounding. The inclusion of wiring in addition to cryogenic cooling lends the design for mounting detectors that typically require cooling to maintain sensitivity such as energy dispersive x-ray detectors and greatly improving signal collection efficiency. The cryogenically cooled tip 314 will also work as a cryopump by adsorbing gas molecules and improving the high vacuum status of the instrument. Some mass spectrometers and other analytical instruments use focused ion beams to sputter samples for analysis. Using a cryo-probe, FIB users could also collect ion beam sputtered samples from the gaseous state for further analysis on other instruments.

Figure 4A:
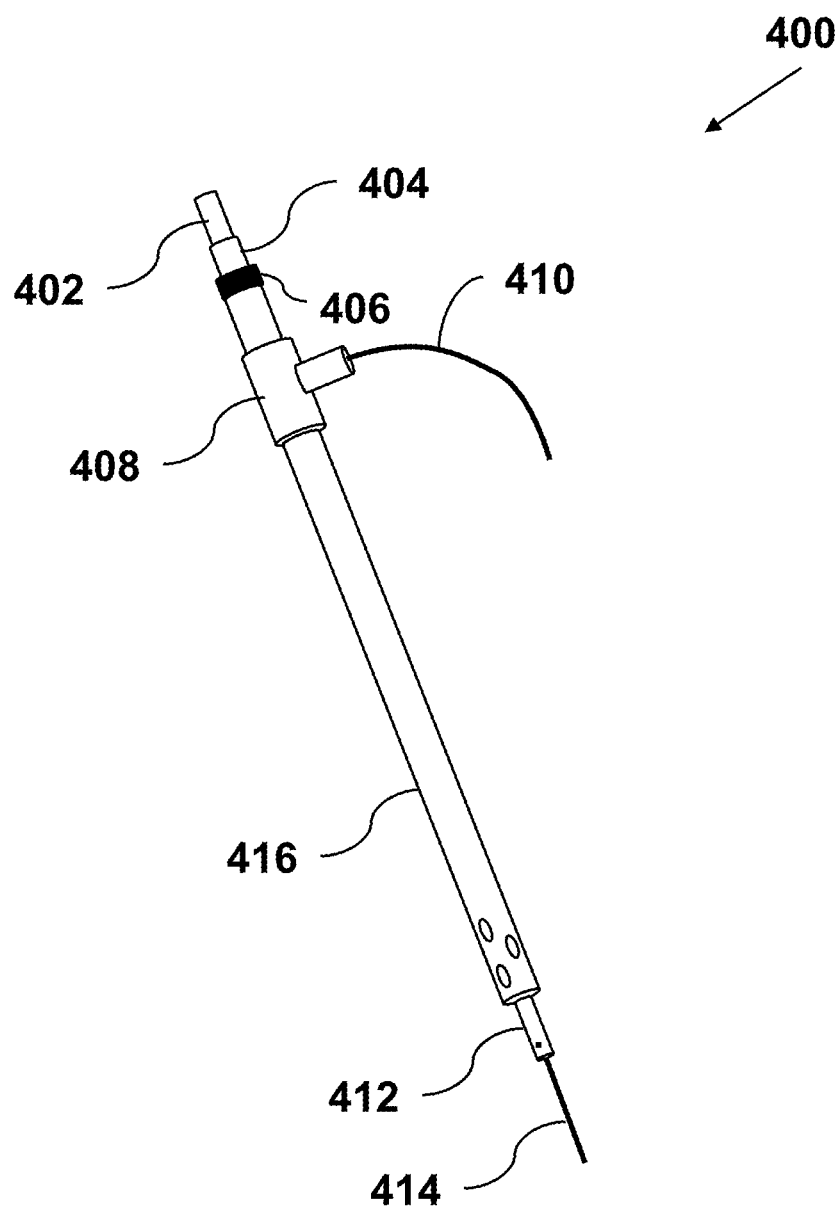
Figure 4B:
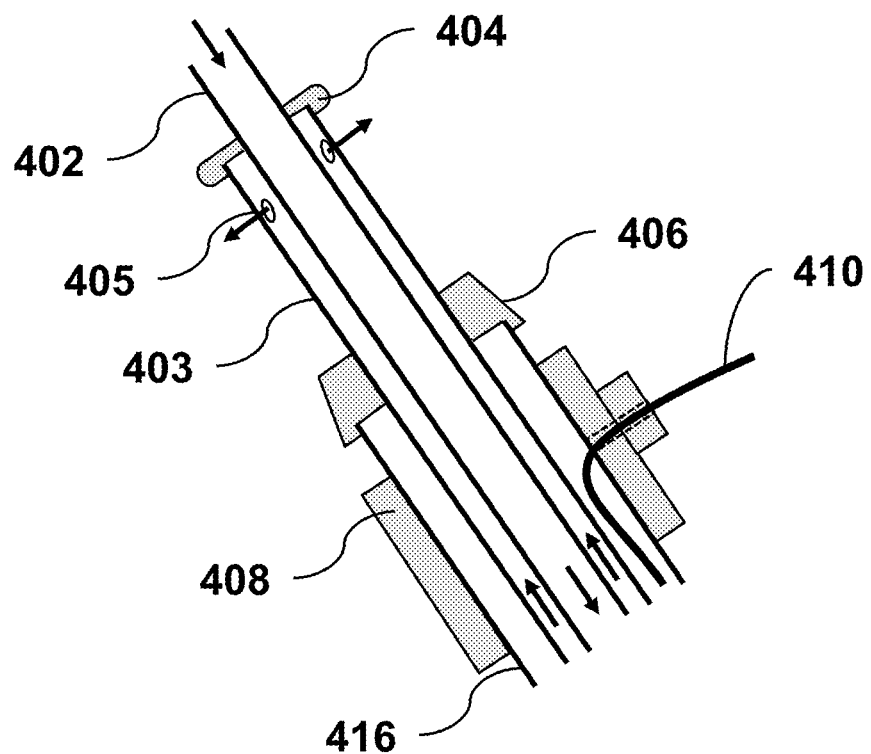

FIG. 4A is another view of a probe 400, detailing fittings and adapters used at the atmosphere end of the probe Inner tube 402 is used as the inlet for coolant flowing down toward the tip of the probe. Tube adapter 404 creates an annular seal of the space between the innermost tube and central tube. The seal is preferably not welded in order to reduce stress from contraction. Similarly, adapter 406 creates an annular seal between the central tube and outermost tube 416. Fitting 408 allows a vacuum sealed passage for the wiring 410 that extends down the length of the probe and out through holes in cooled heatsink 412 which conductively cools the tip 414. These elements are shown in more detail in FIGS. 4B-4D, which shown the atmosphere end and vacuum end of the probe, respectively. FIG. 4B shows an outlet 405 for coolant returning from the tip of the probe. In operation, coolant flows through the central tube 402 toward the probe tip, then back through the space between the two innermost tubes 402 and 403. The space between the two outermost tubes 403 and 416 remains a vacuum. In some embodiments of the invention, the atmospheric end of the probe may include a gas cooling junction which allows rotation at cryogenic temperatures, as shown in FIG. 4C. The junction includes a loose-fitting shell 422 surrounding a compression tube fitting 420 with bearing (e.g., teflon, Kel-F, or ball-bearing mechanism). Shell 422 localizes the vented gas to maintain a dry and cold environment, because without the presence of the dry gas, water would deposit around the junction and it would not rotate freely. Flexible tube 424 provides vacuum insulation around central tube 426 which carries the coolant into the junction.

Figure 4D:
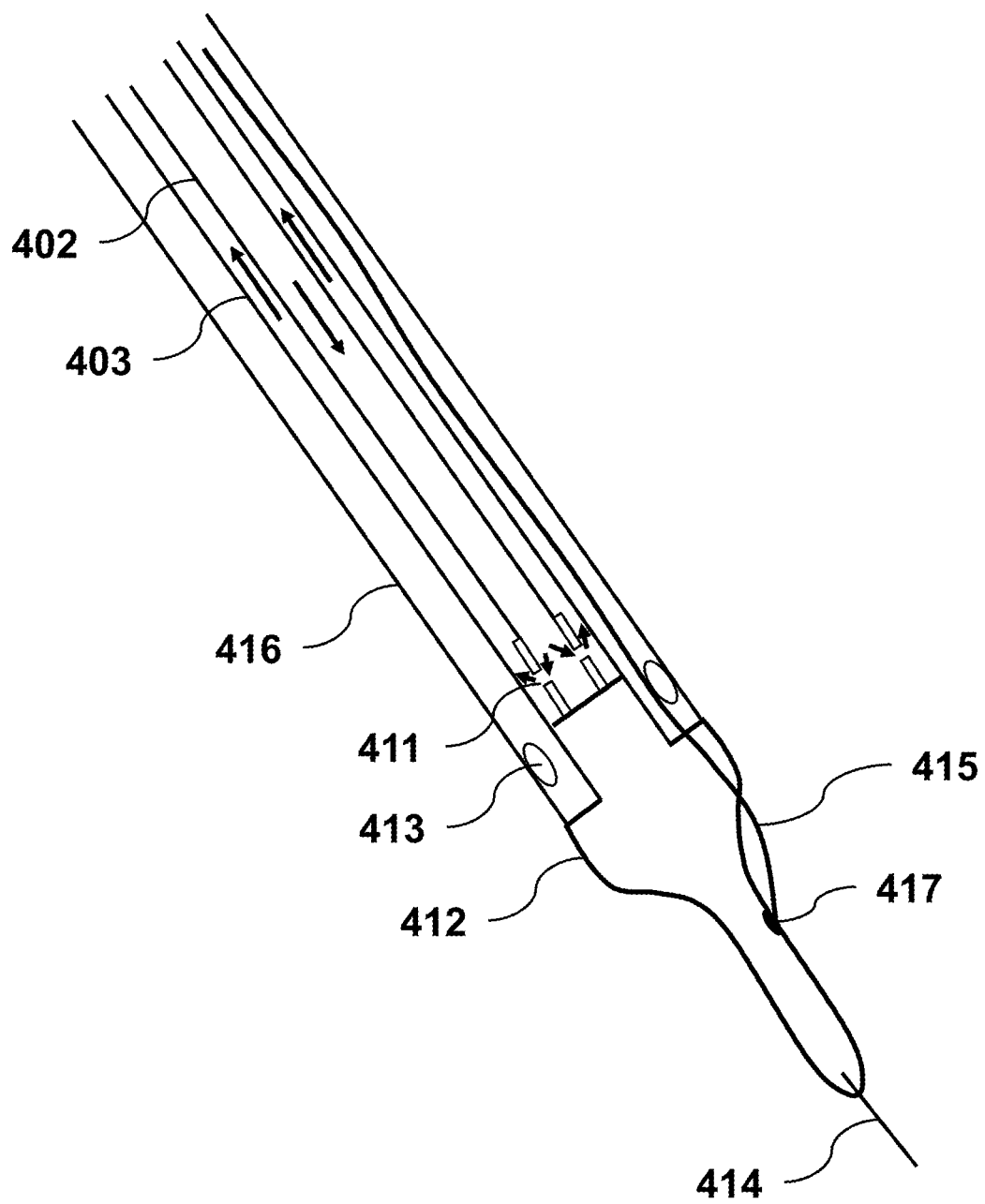

As shown in FIG. 4D, holes 413 expose the space between the two outermost tubes 403 and 416 to a vacuum in the chamber. Holes 411 machined into the heatsink where the inner tube 402 and middle tube 403 are mounted allow the cooling fluid flowing down the inside of the inner tube 402 to pass into the space between tubes 402 and 403, then return back up and out. The heatsink also contains a small hole for thermocouple wiring 415 to pass and connect to a thermocouple 417 near the probe tip.

A major problem overcome by the present invention is the severe expansion and contraction of the probe from any temperature instability. Controlling the expansion and contraction of the probe while in use is extremely important to make such a probe practically useful. Failure to overcome this obstacle is a potential reason that in situ lift-out has not been successfully realized in the past. If the temperature of the probe changes by just 0.01 degrees, the probe will expand or contract enough to make it unusable.

There are two expansion and contraction modes to be concerned with: the fast expansion/contraction changes while the probe is in flux such as during heating or cooling, and the slow expansion/contraction changes while the probe is coming to equilibrium. The present inventor has empirically determined that with the probe moves about 2.8 micrometers for every degree Celsius change that is observed while the temperature is in flux and that it will continue to expand/contract slowly as the rest of the system comes to equilibrium. Once the cooled area of the probe has stopped changing temperature, the stainless steel tubing which makes up the rest of the probe will undergo some temperature change as it comes to an equilibrium state.

Without any modification, the probe is stable enough to use, provided sufficient time is given to reach thermal equilibrium and steps are taken to ensure that the cooling system performance remains stable. For the cooling system in one embodiment, a copper tubing coil 332 is used with gas nitrogen flowing through it. The coil is submerged in liquid nitrogen 318 to cool the gas which runs through the probe for cooling. As the experiment continues, however, liquid nitrogen eventually evaporates from the dewar, slowly exposing more coolant line to air, reducing the cooling performance. To reduce this effect, the conductive/metal portions of the coolant line 332 is submerged at the bottom of the dewar 318 and as the nitrogen evaporates, only less conductive polymer tubing is exposed above the coiled portion of the coolant line. In another embodiment, a custom dewar runs cooling lines through ports at the bottom of the dewar and there is thus no change in the exposure of the coolant lines to the liquid nitrogen. In yet another embodiment, the expansion/contraction of the probe is controlled using very fine temperature control. This may be accomplished, for example, by providing enough coolant to cool the probe to −180 C and then using a resistive heater and a thermostat with heating/cooling precision down to 0.001 C.

Figure 5:
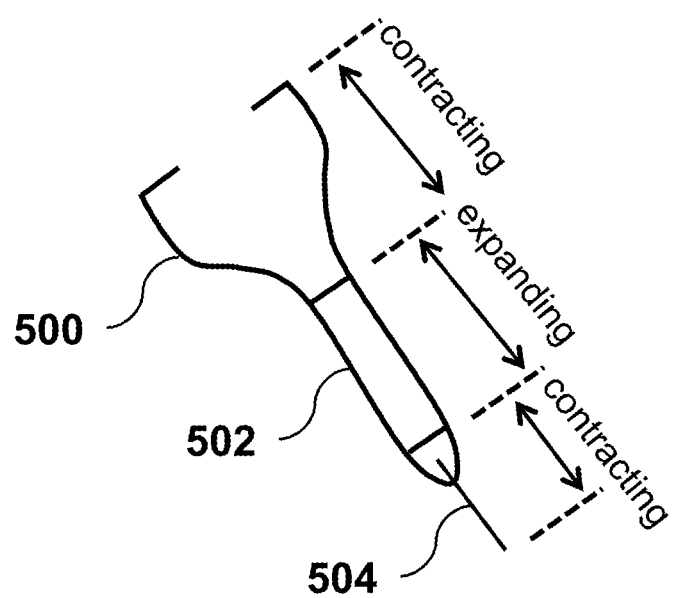
FIG. 5 illustrates a probe heat sink tip constructed with a material having a negative thermal expansion coefficient, according to an embodiment of the present invention.

In other embodiments, the probe is designed so that it expands and contracts less during temperature changes, making the probe much more usable for inexperienced users. In one embodiment, shown in FIG. 5, the probe heat sink is constructed by inserting a material having a negative thermal expansion coefficient. Heat sink 500 is divided and a cylindrical portion of material 502 having negative thermal expansion coefficient is inserted. One such material, for example, is zirconium tungstate $(Zr(WO_4)_2)$ which has a negative thermal expansion coefficient on the same order of magnitude of most positively expanding materials, making it an ideal material for this application. The actively cooled portion of the current prototype probe is approximately two inches long. If approximately half of the longitudinal length of the material in the actively cooled region is composed of the heat sink 500 and probe tip 504 while the other half is made of zirconium tungstate 502, then the fast expansion/contraction of the probe may be neutralized and the probe will be more resistant to minute changes in temperature.

Figure 6A:
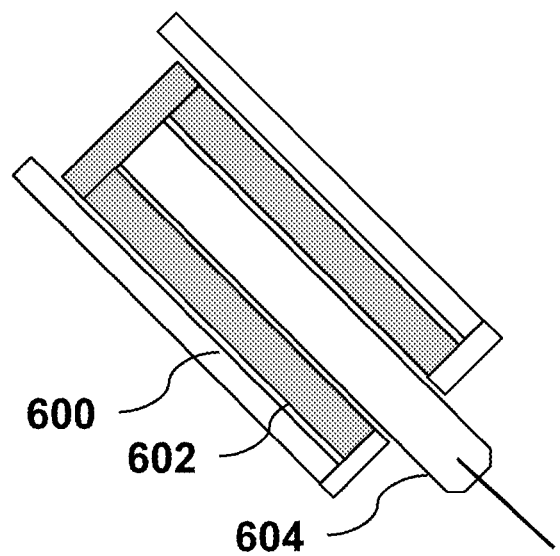
FIGS. 6A-B illustrate a probe tip design based on the gridiron clock pendulum, according to an embodiment of the present invention.
Figure 6B:
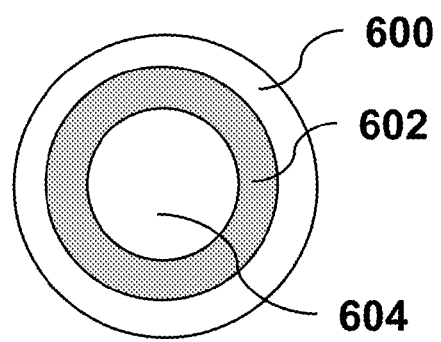

Another method for reducing expansion and contraction of the probe is to use a heat sink in the probe design based on the gridiron clock pendulum, as illustrated in FIGS. 6A-B. By appropriately combining tubes 600, 604 made of two materials with higher expansion/contraction coefficient with tube 602 having lower expansion/contraction coefficient (but preferably with similar rates of expansion), the expansion of 600, 604 can negate the expansion of 602. This principle may also be adapted for use with a negatively expanding material.

Another technique for compensating for expansion and contraction of the probe is to utilize electronically controlled micrometers which would actively measure the temperature of the probe and electronically control the position of the probe as changes are observed in the temperature.

Figure 10:
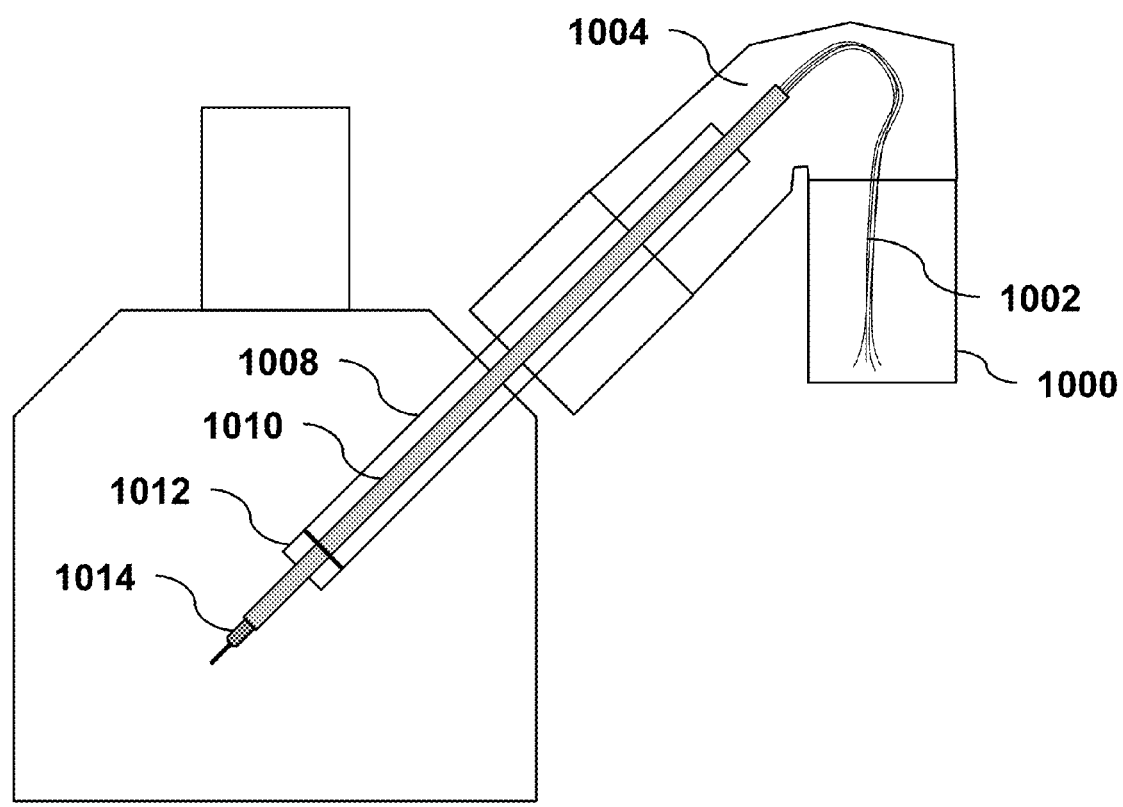
FIG. 10 illustrates a probe design in which cooling is provided by heat conduction down the length of the probe, according to an embodiment of the present invention.

In an alternate embodiment, cooling is provided by heat conduction instead of a coolant flow, as shown in FIG. 10. A dewar 1000 contains cryogenic liquid. Immersed in the liquid is a heat transfer surface such as copper braids 1002 which conducts heat through an insulation region 1004 to a thermally conductive material 1010 running down the length of the probe in its central core, surrounded by a hollow outer tube 1008 which provides vacuum insulation. The probe includes a thermal isolator 1012 near the probe cold tip and needle 1014.

Figure 11:
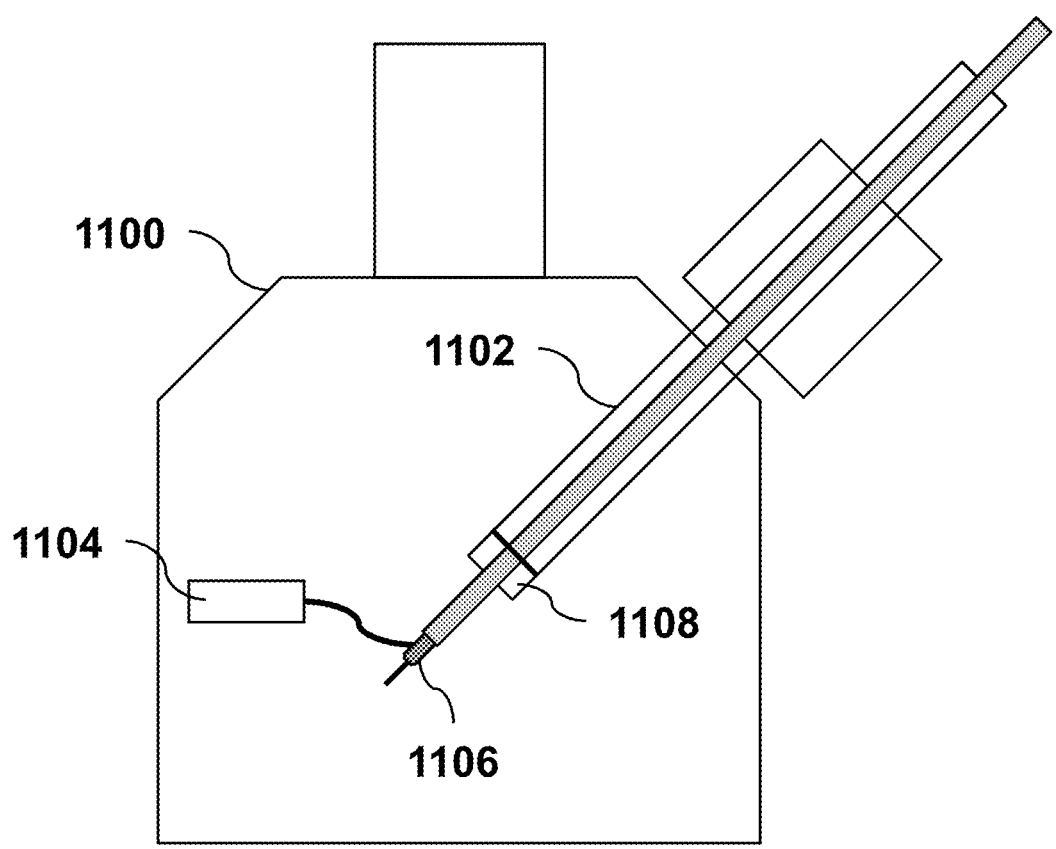
FIG. 11 illustrates a probe design in which the probe tip is conductively-cooled from a cold source within the sample chamber, according to an embodiment of the present invention.

Another embodiment of a conductively-cooled probe tip is shown in FIG. 11. In this case, the probe 1102 enters the sample chamber 1100 at ambient temperature. The cold tip 1106 of the probe is thermally isolated from the main body of the probe 1102 by a thermal isolator 1108. Attached to the cold tip 1106 is a thermally conductive wire that is attached at its other end to a cold surface 1004 inside the sample chamber 1100.

Figure 7:
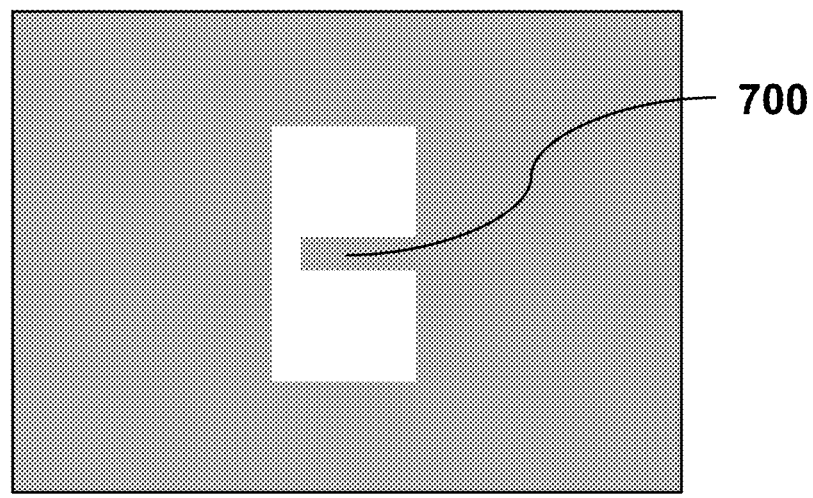
FIG. 7 illustrates a specific sample site of a material sample that has been milled inside the sample chamber using a focused ion beam, according to an embodiment of the present invention.

A probe as described above may be used in a method for cryogenic manipulation of a material sample with an in situ probe. In particular, a probe according to the present invention may be used for cryo lift-out for cryo TEM sample preparation using dual beam FIB. According to such a method, the material sample is mounted on a cryo-stage in a vacuum chamber and the cryo-stage is cooled to a cryogenic temperature using standard techniques. A nano-manipulator probe inside the sample chamber is then cooled using a novel cooled probe design and technique as described herein. A feature of interest, or sample site, of the material sample is identified. The specific sample site of the material sample is then milled inside the sample chamber using a focused ion beam, e.g., material is cut away on two or three sides of the site of interest 700 using the ion beam, as shown in FIG. 7.

In some embodiments, prior to this milling the sample is coated with platinum (Pt) to protect the sample and help smooth out any rough features of the sample which may cause artifacts. To create such a coating, the valve to a platinum gas injector is opened to allow the gas to be deposited across the whole sample in proximity to the injector due to the cryogenic temperature of the sample. The platinum near the site of interest is then modified by imaging the area with the ion beam until the Pt appears smooth.

Figure 8:
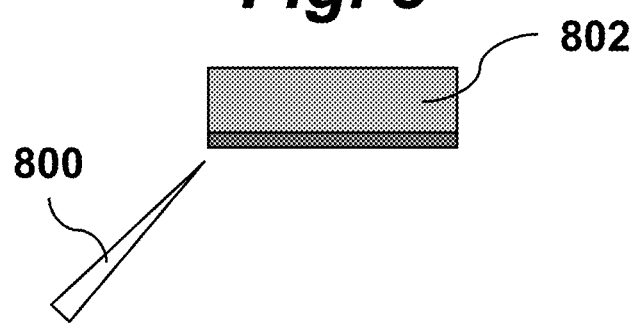
FIG. 8 illustrates a cryo-probe positioned in close proximity to the milled sample in preparation for attachment, according to an embodiment of the present invention.

After the milling of the site of interest, the sample is tilted so that the ion beam can image the cross-section of the sample. Next the cryo-probe 800 is moved into close proximity to the sample 802 (i.e., at most 500 nm away), as shown in FIG. 8, and then the sample site is attached to the cooled probe by vapor deposition of a first blanket layer while the cooled probe is in proximity to the sample site. This blanket layer may be deposited, for example, by opening a gas injector valve to vapor deposit a film across the whole sample. This creates a material bridge between the sample and the probe. Preferably, if using a precursor gas such as that used for Pt gas deposition (reactive upon exposure to the charged particle beam), the film is quickly modified using the ion or electron beam post deposition to assure a continuous film.

Figure 9:
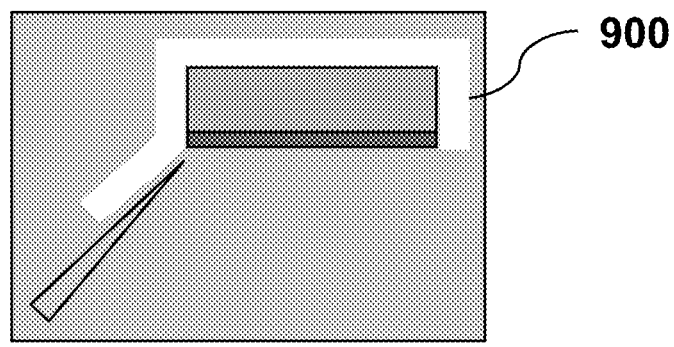
FIG. 9 illustrates a cut using an ion beam to release the sample attached to the probe needle, according to an embodiment of the present invention.

Next, the ion beam is used to cut the sample free from everything except the probe by cutting a section, as shown in FIG. 9. The sample is then lifted out and moved with the probe until the probe and sample is over a destination surface inside the sample chamber (e.g., a transmission electron microscope (TEM) grid.) The lifted-out sample site is then attached to the destination surface by vapor deposition (e.g., using FIB-induced metal deposition) of a second blanket layer. This may be performed as earlier by opening a Pt gas injector to deposit a material film. Deposited precursor gases (such as used in Pt) are preferably then passivated and then the probe is detached from the sample using the focused ion beam, so that the probe is cut free from the sample. The probe is then removed.

Once the sample has been prepared, cryogenic temperature microscopy on the sample site may be performed inside the sample chamber (e.g., using electrons, photons, or ions). Sample analysis may be performed (e.g., transmission electron microscope, Time-of-Flight Secondary Ion Mass Spectrometer (TOF-SIMS), or atom probe), and/or geometric modification of samples may be performed using the focused ion beam (e.g., thinning to a thin lamella for TEM or sharp point for atom probe).

This technique is especially valuable for site-specific focused-ion-beam preparation of hydrated specimens for cryo-electron microscopy. Specifically, a thin section can be lifted-out site specifically from a hydrated biological sample and prepared for cryo-transmission electron microscopy (cryo-TEM). This technique is especially valuable for biological and beam sensitive samples. Cryo-transmission electron microscopy of hydrated-frozen samples provides structural data of cells and organelles in a near native state without the use of chemical fixation and staining Unstained, hydrated, cryo-sections have a potential to be studied using the TEM with great enough resolution for observing molecular level, three-dimensional structures.

For purposes of illustration, a specific preparation technique will now be described in detail. In particular, to prepare a thin cross-section lamella for TEM the ion beam was used to sputter away material on either side of the site of interest to expose a cross-section. The cross-section (approximately 40×25 micrometers) was attached to the cooled micromanipulator probe (−155° C.) by condensing a blanket layer of GIS-Pt, then cut free from the bulk using the FIB. The sample was transferred (and attached using GIS-Pt) to a silicon TEM half-grid (supplied by Dune Science); the probe was cut free after attachment using the FIB. A 10 micrometer section of the sample containing yeast cells was thinned to 300 nm using the FIB and transferred to the cryo-transmission electron microscope for imaging. TEM imaging verified that there was no ice crystal damage and that the sample stayed below the de-vitrification temperature (−140° C.) throughout the preparation.

During the sample thinning process the hydrated sample (cross-section) was imaged periodically to monitor the removal of material and exposed features. While it was tempting to image the sample constantly, it was found that during preparation the sample is very susceptible to heating from the electron beam. Every effort was made to minimize exposure to the electron beam. Interestingly, cryo-samples do not exhibit noticeable heating artifacts when illuminated with the ion beam (below 2.8 nA currents) which allows the operator to use higher ion beam currents to speed up the process with minimal observed damage to the sample.

Ion milling rates are much higher when milling frozen water compared to materials such as silicon or metals; this allowed for slightly different approaches for the preparation of cryo-samples (compared to what are typically used for room temperature solid-state samples). In contrast to frozen water, the platinum layer was more resistant to sputtering with the ion beam. We controlled the sample thickness by observing the thickness of the platinum at the top of the sample. During the thinning process, the majority of milling time was used to remove the platinum protecting layer; the hydrated regions below mill away very quickly once the platinum is removed.

The invention claimed is:

1. A nanomanipulator probe comprising:
   a nanomanipulator probe needle;
   a heatsink probe tip positioned at a vacuum end of the probe and attached to the nanomanipulator probe needle; and
   an outer hollow tube attached to the heatsink probe tip, wherein the outer hollow tube allows wires to pass down an interior conduit of the tube.

2. The nanomanipulator probe of claim 1 wherein the outer hollow tube has at least one hole allowing the wires to exit the probe at the vacuum end of the probe.

3. The nanomanipulator probe of claim 1 further comprising:
   a coolant intake tube coaxially contained within the outer hollow tube and connected to the heatsink probe tip,
   a coolant exhaust tube coaxially contained within the outer hollow tube and connected to the heatsink probe tip,
   wherein a hole joins the coolant intake tube and coolant exhaust tube, allowing coolant to flow between them.

4. The nanomanipulator probe of claim 3 further comprising:
   a coolant inlet port positioned at an atmosphere end of the probe, and
   a coolant outlet port positioned at an atmosphere end of the probe.

5. The nanomanipulator probe of claim 1 further comprising:
   a thermally conductive wire attached to the heatsink probe tip and attached to a cold surface inside a sample chamber containing the vacuum end of the probe.

* * * * *